(12) United States Patent
Trent

(10) Patent No.: US 11,706,908 B2
(45) Date of Patent: Jul. 18, 2023

(54) PROGRAMMABLE WIRE FILAMENTS AND DEVICES

(71) Applicant: Raytheon Company, Waltham, MA (US)

(72) Inventor: Catherine Trent, McKinney, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 17/555,804

(22) Filed: Dec. 20, 2021

(65) Prior Publication Data

US 2022/0201907 A1 Jun. 23, 2022

Related U.S. Application Data

(60) Provisional application No. 63/128,945, filed on Dec. 22, 2020.

(51) Int. Cl.
| | |
|---|---|
| *H05K 9/00* | (2006.01) |
| *H01Q 17/00* | (2006.01) |
| *H01B 7/00* | (2006.01) |
| *H01B 17/54* | (2006.01) |
| *H01C 10/50* | (2006.01) |
| *H01H 37/34* | (2006.01) |

(52) U.S. Cl.
CPC ........... *H05K 9/009* (2013.01); *H01B 7/0054* (2013.01); *H01B 17/54* (2013.01); *H01C 10/50* (2013.01); *H01Q 17/007* (2013.01); *H05K 9/0071* (2013.01); *H01H 37/34* (2013.01)

(58) Field of Classification Search
CPC .......................... H05K 9/0071; H01Q 17/007
See application file for complete search history.

(56) References Cited

U.S. PATENT DOCUMENTS

| | | | |
|---|---|---|---|
| 5,278,562 A * | 1/1994 | Martin | H01Q 17/007 343/873 |
| 5,471,954 A * | 12/1995 | Gonda | A01K 15/021 119/908 |
| 5,528,820 A * | 6/1996 | Collier | H01F 41/063 427/116 |

(Continued)

*Primary Examiner* — Hung V Ngo
(74) *Attorney, Agent, or Firm* — Renner, Otto, Boisselle & Sklar, LLP

(57) ABSTRACT

A switchable wire includes filaments, each of which includes a heat-activated material layer that may be indirectly heated to change its state between different states having different electrical conductivity. In an example embodiment the indirect heating may be electrically resistance heating by passing electrical current through an electrically-resistive core of the filament. The heat passing through an electrically-insulative coating around the core, and into a heat-activated material layer around the electrically-insulative coating. The heat-activated material may be a chalcogenide material that is shiftable between a crystalline electrically-conducting state and an amorphous electrically-insulating state. The state of the material may be controlled by controlling the heating profile through controlling heating in the core. Many such filaments may be twisted together to form a switchable wire. Such wires may be used in any of a variety of devices where switchable electrical conductivity is desired.

21 Claims, 3 Drawing Sheets

(56) References Cited

U.S. PATENT DOCUMENTS

| | | | | |
|---|---|---|---|---|
| 2006/0073655 A1* | 4/2006 | Dennison | ............. | H10N 70/826 |
| | | | | 438/227 |
| 2008/0035907 A1* | 2/2008 | Czubatyj | ............ | H10N 70/8828 |
| | | | | 257/4 |
| 2012/0126149 A1* | 5/2012 | Cobo | ...................... | G21F 7/061 |
| | | | | 250/505.1 |
| 2014/0175356 A1* | 6/2014 | Wang | ..................... | H10N 70/25 |
| | | | | 257/2 |

* cited by examiner

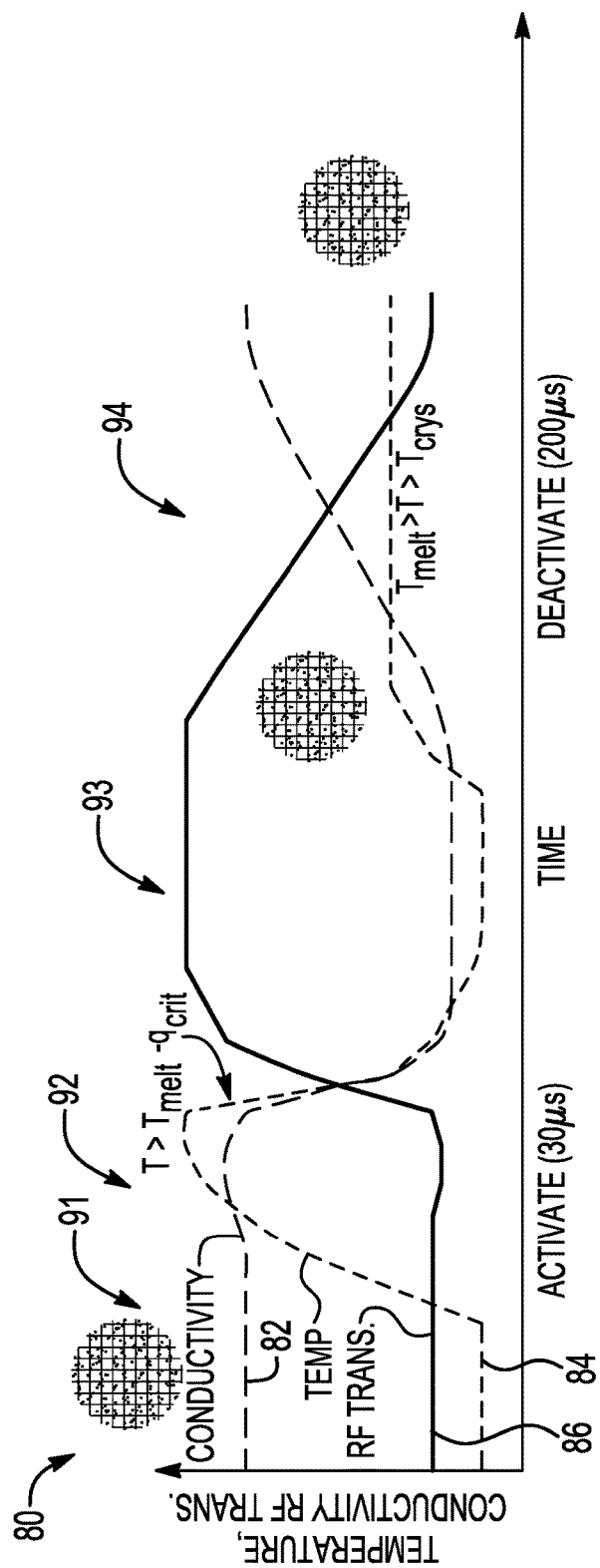
FIG. 5
FIG. 6
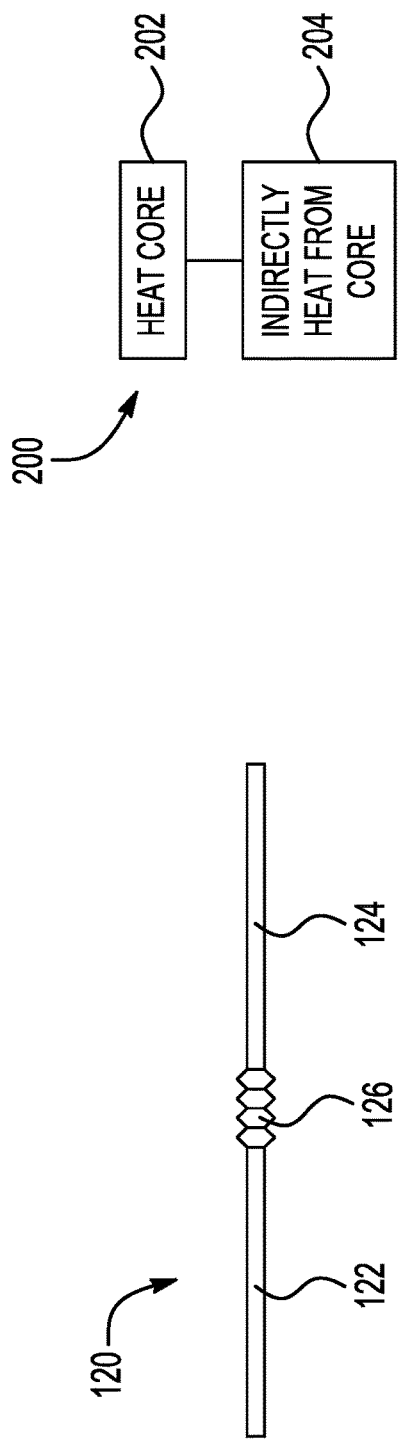
FIG. 7

PROGRAMMABLE WIRE FILAMENTS AND DEVICES

RELATED APPLICATION

This application claims the benefit of U.S. Provisional Application No. 63/128,945 filed Dec. 22, 2020, which is hereby incorporated herein by reference in its entirety.

TECHNICAL FIELD

The disclosure is in the field of switchable electrical conductors.

DESCRIPTION OF THE RELATED ART

Programmable wiring takes the form of a wire plus a switch, so that actuating the switch changes the effective electrical conductivity of a wire segment. Switches used in such wiring have included MEMS switches, transistors, and photoconductors.

SUMMARY

A filament for a wire has variable (switchable) electrical conductivity, controlled by indirect heating.

According to an aspect of the disclosure, a filament includes: an electrically-resistive core; an electrically-insulative coating around the core; and a heat-activated material layer around the electrically-insulative coating.

According to an embodiment of any paragraph(s) of this summary, the electrically-insulative coating is in contact with the electrically-resistive core.

According to an embodiment of any paragraph(s) of this summary, the heat-activated material layer is in contact with the electrically-insulative coating.

According to an embodiment of any paragraph(s) of this summary, the heat-activated material layer is a coating on the electrically-insulative coating.

According to an embodiment of any paragraph(s) of this summary, the electrically-insulative coating is thermally transmissive.

According to an embodiment of any paragraph(s) of this summary, the electrically-resistive core is made of a carbon nanotube material.

According to an embodiment of any paragraph(s) of this summary, the electrically-resistive core functions as a heater for heating the heat-activated material layer.

According to an embodiment of any paragraph(s) of this summary, the electrically-resistive core is operatively coupled to the heat-activated material layer, to provide electrical heating to the heat-activated material layer.

According to an embodiment of any paragraph(s) of this summary, the electrically-resistive core provides heating to selectively melt the heat-activated material layer.

According to an embodiment of any paragraph(s) of this summary, the electrically-insulative coating includes silicon nitride.

According to an embodiment of any paragraph(s) of this summary, the electrically-insulative coating includes silicon carbide.

According to an embodiment of any paragraph(s) of this summary, the electrically-insulative coating includes aluminum oxide.

According to an embodiment of any paragraph(s) of this summary, the heat-activated material layer includes a chalcogenide material.

According to an embodiment of any paragraph(s) of this summary, the chalcogenide material includes a sulfide.

According to an embodiment of any paragraph(s) of this summary, the chalcogenide material includes a selenide.

According to an embodiment of any paragraph(s) of this summary, the chalcogenide material includes a telluride.

According to an embodiment of any paragraph(s) of this summary, the chalcogenide material includes a polonide.

According to an embodiment of any paragraph(s) of this summary, the heat-activated material layer includes a bi-stable heat-activated material.

According to an embodiment of any paragraph(s) of this summary, the heat-activated material layer includes a heat-activated material with an electrically-insulting state and an electrically-conducting state.

According to an embodiment of any paragraph(s) of this summary, the heat-activated material layer includes a heat-activated material with an amorphous state and a crystalline state.

According to an embodiment of any paragraph(s) of this summary, in the amorphous state the heat-activated material is electrically insulating.

According to an embodiment of any paragraph(s) of this summary, in the crystalline state the heat-activated material is electrically conducting.

According to an embodiment of any paragraph(s) of this summary, the heat-activated material is reversibly switchable between the states.

According to an embodiment of any paragraph(s) of this summary, the electrically-resistive core is used to selectively heat the heat-activated material layer, to selectively change electrical properties of the heat-activated material layer.

According to an embodiment of any paragraph(s) of this summary, the state of the heat-activated material after melting depends upon the cooling of the heat-activated material.

According to an embodiment of any paragraph(s) of this summary, the cooling of the heat-activated material that affects the state of the heat-activated material after melting depends upon the current profile of current through the electrically-resistive core.

According to an embodiment of any paragraph(s) of this summary, the filament has a diameter of 20 nm to 1 μm.

According to an embodiment of any paragraph(s) of this summary, the electrically-resistive core includes a material having an electrical resistance of ~$10^6$ to $10^7$ S/m.

According to an embodiment of any paragraph(s) of this summary, the electrically-resistive core has a diameter of 10 nm to 100's of microns.

According to an embodiment of any paragraph(s) of this summary, the electrically-insulative coating is made of a material having a thermal conductivity of at least 2 W/mk.

According to an embodiment of any paragraph(s) of this summary, the electrically-insulative coating has a thickness of several angstroms to a few microns.

According to an embodiment of any paragraph(s) of this summary, the electrically-insulative coating has a melting temperature greater than the electrically resistive core.

According to an embodiment of any paragraph(s) of this summary, the heat-activated material layer has a thickness of several angstroms to a few microns.

According to an embodiment of any paragraph(s) of this summary, the heat-activated material layer includes a material with a melting temperature greater than the electrically resistive core.

According to an embodiment of any paragraph(s) of this summary, the filament is twisted together with other similar filaments.

According to an embodiment of any paragraph(s) of this summary, the twisted-together filaments constitute a wire.

According to an embodiment of any paragraph(s) of this summary, the wire has a diameter of 1 μm to 20 μm.

According to an embodiment of any paragraph(s) of this summary, the wire is flexible.

According to an embodiment of any paragraph(s) of this summary, the wire constitutes a switchable device for selectively allowing or preventing electrical conduction therethrough.

According to an embodiment of any paragraph(s) of this summary, the wire constitutes a switchable device switchable from insulating state and a metallic state.

According to an embodiment of any paragraph(s) of this summary, the switchable device changes sheet resistance by a factor of at least 100.

According to an embodiment of any paragraph(s) of this summary, the switchable device changes sheet resistance by a factor of at least 1000.

According to an embodiment of any paragraph(s) of this summary, in one state the sheet resistance on the order of 1 ohm/square.

According to an embodiment of any paragraph(s) of this summary, in another state the sheet resistance on the order of 2000 ohm/square.

According to an embodiment of any paragraph(s) of this summary, the switchable device is part of an antenna.

According to an embodiment of any paragraph(s) of this summary, the antenna is a switchable antenna able to be reconfigured to preferentially receive different frequencies of energy.

According to an embodiment of any paragraph(s) of this summary, the switchable device is part of an electro-magnetic interference (EMI) shield.

According to an embodiment of any paragraph(s) of this summary, the switchable device is part of a programmable interconnect.

According to an embodiment of any paragraph(s) of this summary, the switchable device is part of a radio frequency (RF) shield.

According to an embodiment of any paragraph(s) of this summary, the switchable device is part of a frequency-selective surface.

According to an embodiment of any paragraph(s) of this summary, the switchable device selectively allows or prevents electrical conduction across a gap in a conductive film on a substrate.

According to an embodiment of any paragraph(s) of this summary, the switchable device is one of a series of switchable devices that selectively allow or prevent electrical conduction across respective gaps in a conductive film on a substrate.

According to another aspect of the disclosure, a method of changing electrical conductivity of a filament includes the steps of: electrical resistive heating a core of the filament; and indirectly heating a heat-activated material layer of the filament that surrounds the core, using the heat from the electrical resistive heating of the core, the heating of the heat-activated material used in selectively changing the electrical conductivity of the heat-activated material.

According to an embodiment of any paragraph(s) of this summary, the method uses a filament and/or other device according to any paragraph(s) of this summary.

According to an embodiment of any paragraph(s) of this summary, the indirectly heating includes thermal conductive heating.

According to an embodiment of any paragraph(s) of this summary, the thermal conductive heating is through an electrically-insulative coating around the core, the electrically-insulative coating being between the core and the heat-activated material.

According to an embodiment of any paragraph(s) of this summary, the selectively changing of the electrical conductivity of the heat-activated material includes changing the heat-activated material between an amorphous state and a crystalline state.

According to an embodiment of any paragraph(s) of this summary, the changing the heat-activated material from the crystalline state to the amorphous state includes melting the heat-activated material.

According to an embodiment of any paragraph(s) of this summary, the changing the heat-activated material from the amorphous state to the crystalline state includes heating the heat-activated material above a crystallization temperature, while maintaining the heat-activated material below a melting temperature.

According to an embodiment of any paragraph(s) of this summary, the method of changing electrical conductivity is part of a method of switching a device that includes multiple of the filaments, such as a wire, between a high-electrical-conductivity state, and a low-electrical-conductivity state.

According to an embodiment of any paragraph(s) of this summary, the method is part of changing the frequency characteristics or other operating characteristics of an antenna.

According to an embodiment of any paragraph(s) of this summary, the method is part of changing the transmissivity and/or other characteristics of a frequency-selective device.

According to another aspect, a variable-electrical-resistance wire includes plural filaments in contact with one another. Each of the filaments includes: an electrically-resistive core; an electrically-insulative coating around the core; and a heat-activated material layer around the electrically-insulative coating. Heating changes state of the heat-activated material layer, and thus wire as well, between an electrically-insulating state and an electrically-conducting state.

According to still another aspect, a shielding device includes: a substrate; an electrically-conductive film on the substrate; and switchable devices across respective gaps in the electrically-conductive film. The switchable devices each include plural filaments in contact with one another. Each of the filaments including: an electrically-resistive core; an electrically-insulative coating around the core; and a heat-activated material layer around the electrically-insulative coating. Heating changes state of the heat-activated material layer, and thus wire as well, between an electrically-insulating state and an electrically-conducting state.

To the accomplishment of the foregoing and related ends, the disclosure comprises the features hereinafter fully described and particularly pointed out in the claims. The following description and the annexed drawings set forth in detail certain illustrative embodiments of the disclosure. These embodiments are indicative, however, of but a few of the various ways in which the principles of the disclosure may be employed. Other objects, advantages and novel features of the disclosure will become apparent from the following detailed description of the disclosure when considered in conjunction with the drawings.

BRIEF DESCRIPTION OF DRAWINGS

The annexed drawings, which are not necessarily to scale, show various aspects of the disclosure.

FIG. 5 is a timeline illustrating operation of the device of FIG. 3A.

FIG. 6 is a schematic diagram illustrating a switchable antenna according to an embodiment of the present disclosure.

FIG. 7 is a high-level flow chart showing steps of a method according to the present disclosure.

DETAILED DESCRIPTION

A switchable wire includes filaments, each of which includes a heat-activated material layer that may be indirectly heated to change its state between different states having different electrical conductivity. In an example embodiment the indirect heating may be electrically resistance heating by passing electrical current through an electrically-resistive core of the filament. The heat passing through an electrically-insulative coating around the core, and into a heat-activated material layer around the electrically-insulative coating. The heat-activated material may be a chalcogenide material that is shiftable between a crystalline electrically-conducting state and an amorphous electrically-insulating state. The state of the material may be controlled by controlling the heating profile through controlling heating in the core.

Many such filaments may be twisted together to form a switchable wire. Such wires may be used in any of a variety of devices where switchable electrical conductivity is desired. Examples include programmable antennas, programmable interconnects, programmable electromagnetic interference (EMI) screens, and radio frequency (RF) and electro-optical/infrared (EO/IR) shared apertures.

Figure 1:
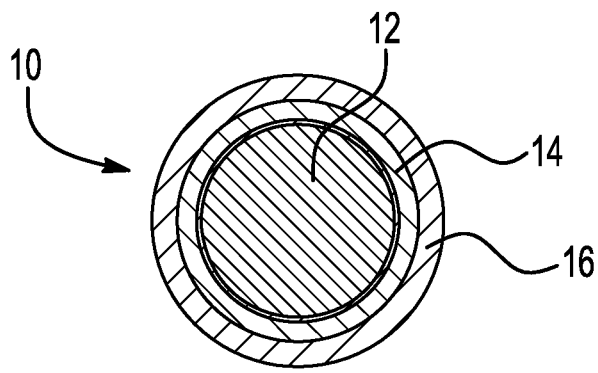
FIG. 1 is a cross-sectional view of a filament according to an embodiment of the disclosure.

FIG. 1 shows a filament 10 which has a switchable electrical conductivity. The filament has a core 12, a coating 14 around the core 12, and a material layer 16 around the coating 14. The core 12 may be an electrically-resistive core, the coating 14 may be electrically-insulative coating, and the material layer 16 may be a heat-activated material layer.

Functionally, passing electrical current through the core 12 allows indirect heating of the material layer 16, with heat conducted from the core 12 through the coating 14, and to the material layer 16. Heating the material layer 16 may be used to selectively, repeatably, and reversibly change the configuration (state) of the material in the layer 16, such as from amorphous to crystalline (or the reverse). This changes the material of the layer 16, and thereby the filament 10, between an electrically-conducting state and an electrically-nonconducting state. The electrically-resistive core may include a material having an electrical resistance of (~0.5-5 ohms/square), to facilitate material heating.

The facilitate the heat conduction the electrically-insulative coating 14 may be in contact with the electrically-resistive core 12, and the heat-activated material layer 16 may be in contact with the electrically-insulative coating 14. The heat-activated material layer 16 may be a coating on the electrically-insulative coating. The electrically-insulative coating 14 may be thermally transmissive, for example having a thermal conductivity (~2 W/mk) to allow for temperature transfer between the conductor and the phase change material.

The electrically-resistive core 12 may be made of a carbon nanotube material, although other suitable materials may be used as alternatives. As noted above, the core 12 functions as a heater for indirectly heating the heat-activated material layer 16, providing electrically-resistive heating to selectively melt the heat-activated material layer 16.

The electrically-insulative coating 14 may include any of a variety of suitable materials. Non-limiting examples of suitable materials silicon nitride, silicon carbide, and aluminum oxide.

The heat-activated material layer 16 may include a chalcogenide material. Non-limiting examples of suitable chalcogenide materials include sulfides, selenides, tellurides, and polonides.

The heat-activated material layer 16 may include a bi-stable heat-activated material. The material of the layer 16 may be in an electrically-insulting state or an electrically-conducting state. The states of the layer 16 may include an amorphous state and a crystalline state. In the amorphous state the heat-activated material may be electrically insulating, and in the crystalline state the heat-activated material is electrically conducting. The heat-activated material of the layer 16 may be reversibly switchable between the states.

The state of the heat-activated material of the layer 16 after melting (and upon solidification) depends upon the cooling of the heat-activated material. The cooling of the heat-activated material that affects the state of the heat-activated material after melting depends upon the current profile of current through the electrically-resistive core.

The filament 10 may have any of a variety of sizes. In a non-limiting example range, the filament may have a diameter of 20 nm to 1 μm. The electrically-resistive core 12 may have a diameter of 1 to 100's of microns. The electrically-insulative coating 14 may have a thickness of a few microns. The heat-activated material layer 16 may have a thickness from a few angstroms to several microns.

The electrically-resistive coating 14 has a melting temperature less than that of the material of the layer 16. The electrically-insulative coating 14 may have a melting temperature of at least 70° C., and the material of the layer 16 may have a melting temperature greater than 70° C.

Figure 2:
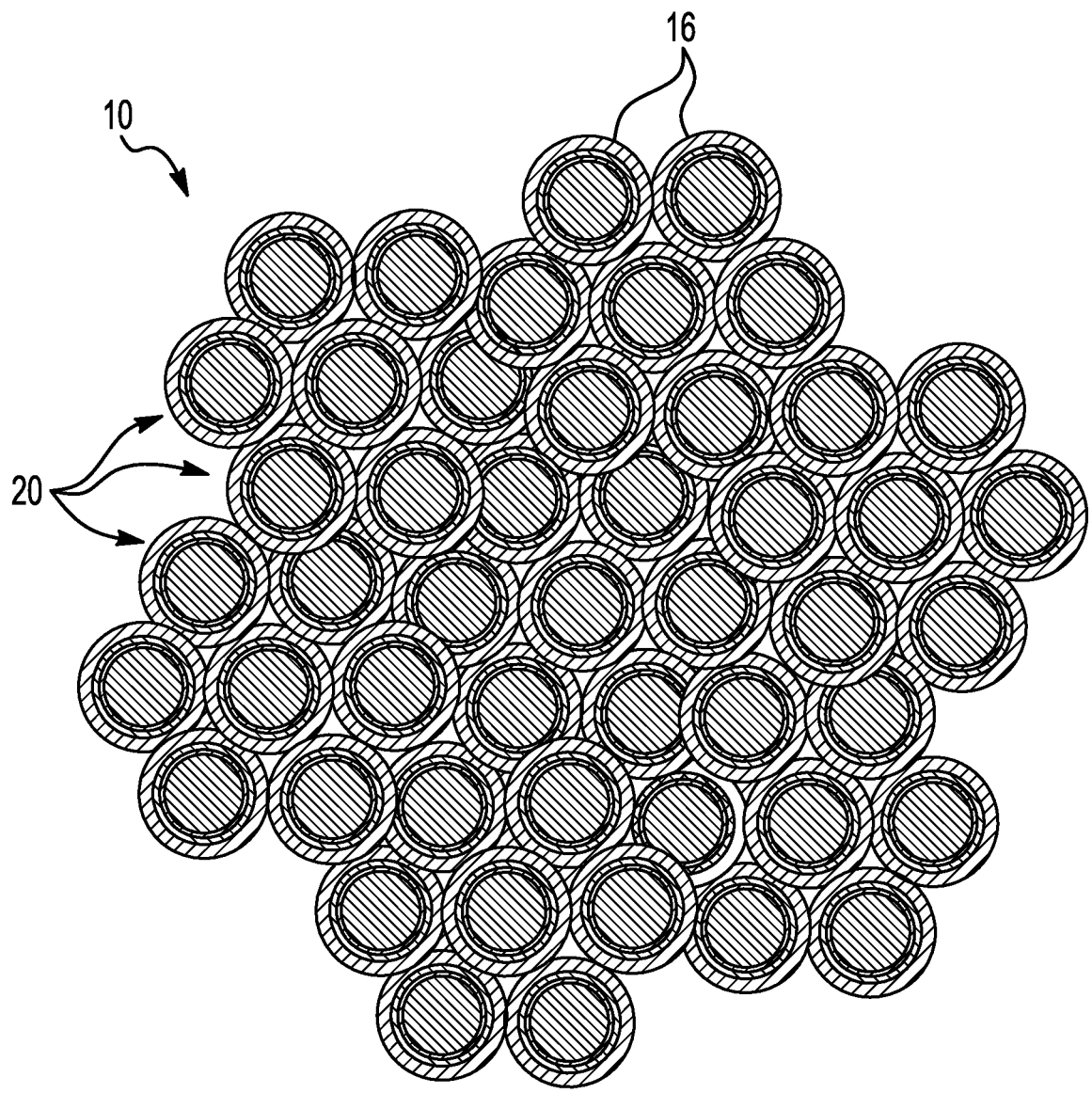
FIG. 2 is a cross-sectional view of a wire that includes multiple filaments, according to an embodiment of the disclosure.

Turning now in addition to FIG. 2, multiple of the filaments 10 described above may be combined to form a wire 20. The combination may involve twisting the filaments 10 together, to form a wire yarn. The wire 20 may be flexible, and may be have a diameter of 1 μm to 20 μm, to give one non-limiting example size range.

The wire 20 constitutes a switchable device for selectively allowing or preventing electrical conduction therethrough. The wire 20 may be switchable between an insulating state and a metallic state, with the different states of the material of the layer 16 of the filaments 10 defining the insulating and metallic states. The switchable device may change sheet resistance by a factor of at least 100, or by a factor of at least 1000, to give nonlimiting example ranges. For example, in one state the sheet resistance on the order of 1 ohm/square, while in another state the sheet resistance on the order of 2000 ohm/square.

The switchable device that is (or includes) the wire 20 may be used as a part of a variety of devices, only some of which are shown and/or described herein. For example, the switchable device may be part of an antenna, such as a switchable antenna that is able to be reconfigured to preferentially receive different frequencies of energy.

Alternatively, the switchable device is part of an electromagnetic interference (EMI) shield, a programmable interconnect, and/or a radio frequency (RF) shield. Broadly, the switchable device may be part of a frequency-selective surface, for example with the switchable device selectively allowing or preventing electrical conduction across a gap in a conductive film on a substrate, such as a non-conductive (electrically-insulating) substrate. In such a use, switchable device (such as the wire 20) may be one of a series of switchable devices that selectively allow or prevent electrical conduction across respective gaps in a conductive film on a substrate.

In operation the wire 20 may be thin enough to get heat in and out fast enough to efficiently reconfigure the heat-activated material layers 16 of the various filaments 16. This allows reversible reconfiguring the material layers 16 between their states (such as amorphous or crystalline states), to allow change of the electrical conductivity characteristics of the wire 20.

Figure 3A:
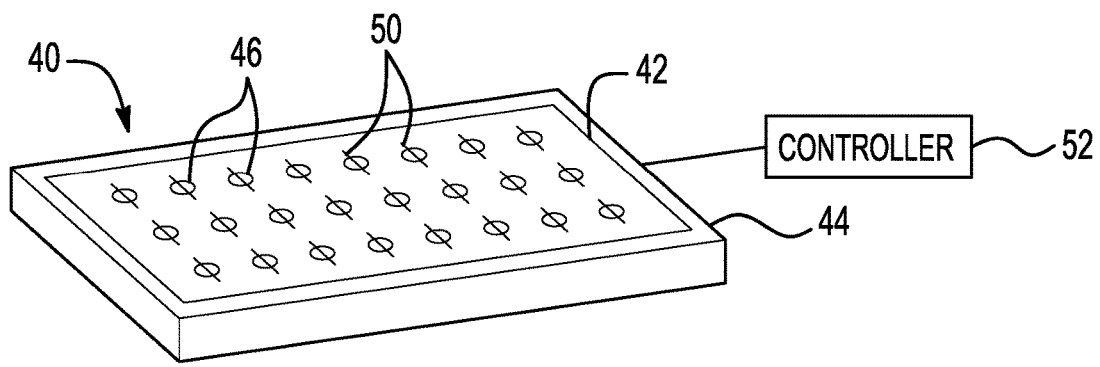
FIG. 3A is an oblique view schematically showing a device according to an embodiment of the disclosure.

FIG. 3A schematically shows a shielding device, or more broadly a frequency-selective surface device 40. The device 40 includes a conductive film 42 atop a substrate 44. The conductive film 42 has a series of apertures 46 in it. The apertures At least some of the apertures 46 have respective switchable devices 50 across them or otherwise interacting with them. The switchable devices 50 may be similar to the switchable devices (or wires) 20 (FIG. 2) described earlier. The switchable devices 50 may short circuit the apertures or otherwise affect the operability of the apertures 46 in letting radiation therethrough. This may change the transmissivity of the device 40, and/or may change the profile of frequencies of radiation that pass through the device 40.

The conductive film 42 may be made of gold or another conductive metal or material. The apertures 46 may have any of a variety of suitable shapes, such as circular or rectangular.

The switchable devices 50 may be controlled through suitable controllers and suitable circuitry for controlling the flow of current, to control by indirect heating of heat-activated material of filaments, electrical conductivity. For example, the devices 50 may be coupled to a controller 52, which may be or may include suitable processor(s), circuitry, software and/or hardware, and/or other suitable components. The switchable devices 50 may be controlled individually, or in suitable groups.

Figure 3B:
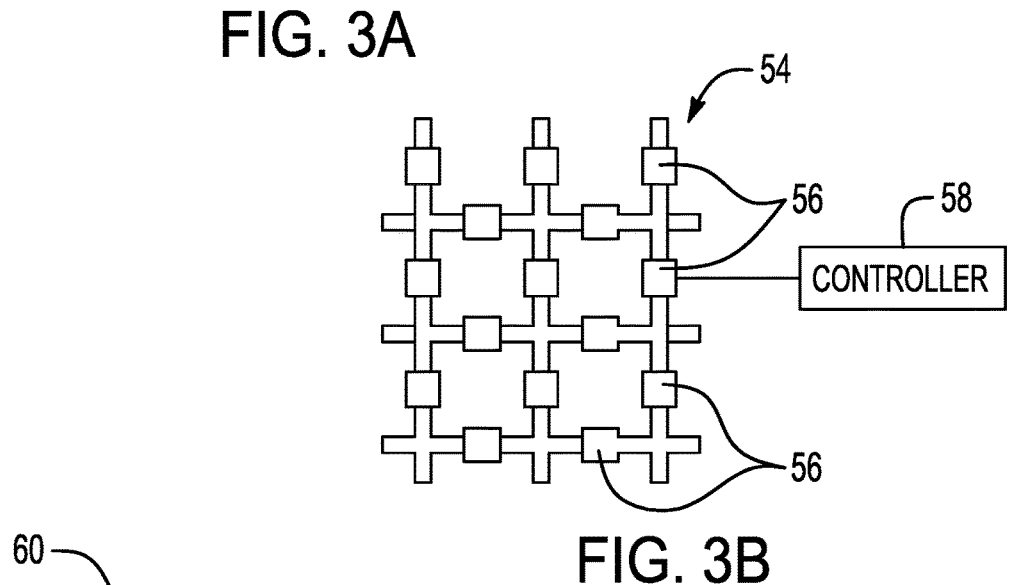
FIG. 3B is an oblique view schematically showing a grid device according to an embodiment of the disclosure.

Other configurations are possible, with for example a variable radiation-transmissivity device including a grid of wires or switchable devices. An example of such a device is shown in FIG. 3B, which shows a wire grid 54 having switchable devices 56 that are operatively coupled to a controller 58. Control of electrical conductivity in the switchable devices of the grid affects, for instance, the frequencies and/or amounts of radiation transmitted through a frequency-selective surface device.

Figure 4:
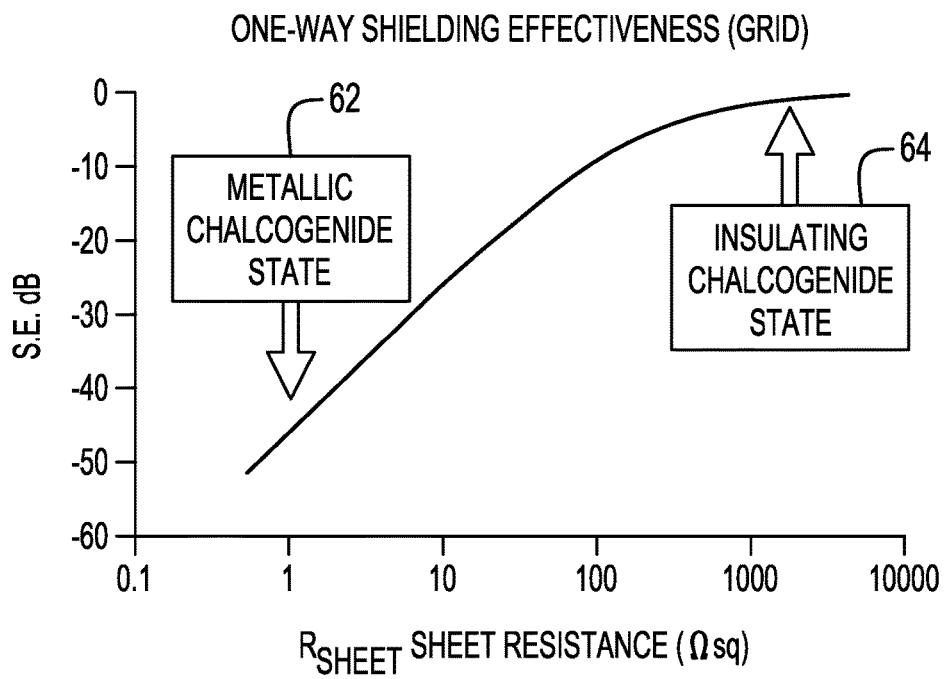
FIG. 4 is a graph showing shield effectiveness for different states of the device of FIG. 3A.

FIG. 4 shows a graph 60 of shielding effectiveness (S.E.) of an example frequency-selective surface device, such as the device 40 (FIG. 3). The device may be operable in two states, indicated by reference numbers 62 and 64. In the state indicated by reference number 62 the switches (wires) are in a metallic chalcogenide state (crystalline state), with the sheet resistance low and the shielding effectiveness (S.E.) high (high negative dB). In the state indicated by reference number 64 the switches (wires) are in an insulating chalcogenide state (amorphous state), with the sheet resistance high and the shielding effectiveness (S.E.) low (low negative dB).

FIG. 5 illustrates a timeline 80 showing operation of an example frequency-selective surface device, such as the device 40 (FIG. 3A) over time, showing the transition between different modes (states) of operation. The graph shows electrical conductivity 82 of switchable devices 50 (FIG. 3A), temperature 84 of the heat-activated material of the devices 50, and radio frequency (RF) transmissivity 86 of the device 40.

In a first time period 91 the heat-activated material is in a solid crystalline state. This provides a high electrical conductivity for the heat-activated material 16 (FIG. 1), and a low RF transmissibility for the device 40 (FIG. 3A).

In a second time period 92 the heat-activated material 16 (FIG. 1) is activated. Power is provided to the cores 12 (FIG. 1) of the filaments 10 (FIG. 1). This indirectly heats the heat-activated material 16 above its melting temperature $T_{melt}$, disrupting its crystalline structure. This heating may be relatively rapid, for example occurring over 30 µs, which means that the filaments 10 and the wire 20 (FIG. 2) have a rapid response time.

In a third time period 93 the heat-activated material 16 (FIG. 1) cools and solidifies into an amorphous state. This results in a low electrical conductivity for the heat-activated material 16, and a high RF transmissibility for the device 40 (FIG. 3).

In a fourth time period 94 the heat-activated material 16 (FIG. 1) is heated again, but this time to a lower temperature T that is higher than a crystallization temperature $T_{crys}$ of the material, but below the material's melting temperature $T_{melt}$. This transforms the heat-activated material from its amorphous state again to its crystalline state. This again increases the electrical conductivity of the material, and reduces the RF transmissivity of the device 40 (FIG. 3A). The time for this transition may be about 200 µs in a non-limiting example, although it will be appreciated that the times for activation and deactivation may vary greatly on many factors, such as the dimensions of the filaments, the characteristics of the various materials involved, and the time signature of the current applied in the various heating operations.

FIG. 6 shows a schematic of a switchable antenna 120 that includes a pair of antenna segments 122 and 124 linked by a switchable device 126. The switchable device 126 may be similar to the device 20 (FIG. 2) described earlier. Selectively making the device 126 either electrically conducting or electrically insulative controls the effective length of the antenna 120. This controls the frequency response of the antenna 120, allowing the antenna 120 to preferentially receive signals of different frequencies, for example switching between AM radio signals and FM radio signals.

Switches/wires such as those described herein may be used in any of a variety of other suitable devices/applications.

FIG. 7 shows steps of a method 200, for changing electrical conductivity of a filament, such as the filament 10 (FIG. 1). In step 202 there is electrical resistive heating of a core 12 (FIG. 1) of the filament 10. In step 204 the heat produced in the core 12 is used to indirectly heat a heat-activated material layer 16 (FIG. 1) of the filament 10 that surrounds the core 12, with the heating of the heat-activated material used in selectively changing the electrical conductivity of the heat-activated material. Similar steps may occur in multiple filaments combined in a larger device, such as a wire or a switching device, or an even larger device containing the wire or switching device.

Although embodiments have been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the disclosure. In addition, while a particular feature of the disclosure may have been described above with respect to only one or more of several illustrated embodiments, such feature may be combined with one or more other features of the other embodiments, as may be desired and advantageous for any given or particular application.

What is claimed is:

1. A filament comprising:
an electrically-resistive core;
an electrically-insulative coating around the core; and
a heat-activated material layer around the electrically-insulative coating;
wherein the electrically-resistive core functions as a heater for heating the heat-activated material layer.

2. A filament comprising:
an electrically-resistive core;
an electrically-insulative coating around the core; and
a heat-activated material layer around the electrically-insulative coating;
wherein the heat-activated material layer includes a heat-activated material with an electrically-insulting state and an electrically-conducting state.

3. A filament comprising:
an electrically-resistive core;
an electrically-insulative coating around the core; and
a heat-activated material layer around the electrically-insulative coating;
wherein the filament is twisted together with other similar filaments.

4. The device of claim 3, wherein the heat-activated material layer is a coating on the electrically-insulative coating.

5. The device of claim 3, wherein the filament and the other similar filaments each have a diameter of 20 nm to 1 µm.

6. The device of claim 3, wherein the twisted-together filaments constitute a wire.

7. The device of claim 6, wherein the wire has a diameter of 1 µm to 20 µm.

8. The device of claim 6, wherein the wire constitutes a switchable device for selectively allowing or preventing electrical conduction therethrough.

9. The device of claim 6, wherein the wire constitutes a switchable device switchable from an electrically-insulating state and an electrically-conducting state.

10. The device of claim 9, wherein the switchable device changes sheet resistance by a factor of at least 100.

11. The device of claim 9, wherein the switchable device is part of an antenna.

12. The device of claim 11, wherein the antenna is a switchable antenna able to be reconfigured to preferentially receive different frequencies of energy.

13. The device of claim 9, wherein the switchable device is part of a frequency-selective surface.

14. The device of claim 9, wherein the switchable device selectively allows or prevents electrical conduction across a gap in a conductive film on a substrate.

15. The device of claim 9, wherein the switchable device is one of a series of switchable devices that selectively allow or prevent electrical conduction across respective gaps in a conductive film on a substrate.

16. The device of claim 3, wherein the electrically-resistive core functions as a heater for heating the heat-activated material layer.

17. The device of claim 3, wherein the heat-activated material layer includes a heat-activated material with an electrically-insulting state and an electrically-conducting state.

18. A variable-electrical-resistance wire comprising:
plural filaments in contact with one another, each of the filaments including:
an electrically-resistive core;
an electrically-insulative coating around the core; and
a heat-activated material layer around the electrically-insulative coating;
wherein heating changes state of the heat-activated material layer, between an electrically-insulating state and an electrically-conducting state, thereby also changing the wire between an electrically-insulating state and an electrically-conducting state.

19. The device of claim 18, wherein the electrically-resistive core functions as a heater for heating the heat-activated material layer.

20. The device of claim 18, wherein the filaments are twisted together.

21. A shielding device comprising:
a substrate;
an electrically-conductive film on the substrate; and
switchable devices across respective gaps in the electrically-conductive film;
wherein the switchable devices each include plural filaments in contact with one another, each of the filaments including:
an electrically-resistive core;
an electrically-insulative coating around the core; and
a heat-activated material layer around the electrically-insulative coating; and
wherein heating changes state of the heat-activated material layer between an electrically-insulating state and an electrically-conducting state, thereby also changing the wire between an electrically-insulating state and an electrically-conducting state.

* * * * *